US010153073B2

(12) United States Patent
Pagani et al.

(10) Patent No.: US 10,153,073 B2
(45) Date of Patent: *Dec. 11, 2018

(54) INTEGRATED CIRCUIT (IC) INCLUDING SEMICONDUCTOR RESISTOR AND RESISTANCE COMPENSATION CIRCUIT AND RELATED METHODS

(71) Applicant: STMicroelectronics S.r.l., Agrate Brianza (IT)

(72) Inventors: Alberto Pagani, Nova Milanese (IT); Alessandro Motta, Cassano d'Adda (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/614,292

(22) Filed: Jun. 5, 2017

(65) Prior Publication Data

US 2017/0271057 A1    Sep. 21, 2017

Related U.S. Application Data

(63) Continuation of application No. 14/754,799, filed on Jun. 30, 2015, now Pat. No. 9,704,624.

(51) Int. Cl.
*H01C 7/10* (2006.01)
*H01L 27/02* (2006.01)
(Continued)

(52) U.S. Cl.
CPC .............. *H01C 7/10* (2013.01); *H01L 23/34* (2013.01); *H01L 27/0207* (2013.01);
(Continued)

(58) Field of Classification Search
CPC .... H03H 11/245; H03H 11/24; H03K 17/693; H03G 1/0088; H03G 1/007
(Continued)

(56) References Cited

U.S. PATENT DOCUMENTS 4,236,832 A   12/1980   Komatsu et al.
5,757,211 A   5/1998    Phillips
(Continued)

OTHER PUBLICATIONS

Barlian, A.A et al., "Review: Semiconductor Piezoresistance for Microsystems," Proceedings of the IEEE, vol. 97, No. 3, Mar. 2009, 40 pages.
(Continued)

*Primary Examiner* — Anh Q Tra
(74) *Attorney, Agent, or Firm* — Slater Matsil, LLP (57) ABSTRACT

In one example, a method of compensating resistance in an integrated circuit includes providing a four terminal resistor in a semiconductor substrate. The resistor includes a first resistor and a second resistor coupled in series, a first terminal at a first end of the resistor, a second terminal at a second end of the resistor, a test terminal at a node connecting the first resistor and the second resistor, and a tuning terminal. The first resistor has a first conductivity type and the second resistor has a second conductivity type opposite to the first conductivity type. The first resistor includes a first portion extending along a first direction and a second portion extending along a second direction perpendicular to the first direction. The method further includes computing a voltage to be applied at the tuning terminal to compensate the difference between the resistance of the first and the second resistors.

43 Claims, 7 Drawing Sheets

(51) Int. Cl.
H01L 49/02 (2006.01)
H01L 23/34 (2006.01)
H01L 29/36 (2006.01)
H01L 21/66 (2006.01)

(52) U.S. Cl.
CPC .............. *H01L 28/20* (2013.01); *H01L 29/36* (2013.01); *H01L 22/34* (2013.01)

(58) Field of Classification Search
USPC .......................................... 327/308, 512–513
See application file for complete search history.

(56) References Cited

U.S. PATENT DOCUMENTS

| | | | |
|---|---|---|---|
| 6,118,170 | A | 9/2000 | Takahashi et al. |
| 6,369,654 | B1 | 4/2002 | Inagaki et al. |
| 6,448,840 | B2 | 9/2002 | Kao et al. |
| 7,410,293 | B1 | 8/2008 | Santurkar et al. |
| 7,437,260 | B2 | 10/2008 | Ausserlechner et al. |
| 7,696,811 | B2 | 4/2010 | Barrows et al. |
| 7,816,936 | B2 | 10/2010 | Ito |
| 8,446,209 | B1 * | 5/2013 | Horsky .................. H03B 5/04 327/513 |
| 2005/0162160 | A1 | 7/2005 | Ausserlechner et al. |
| 2007/0285293 | A1 * | 12/2007 | Lee ........................ G11C 5/063 341/144 |
| 2010/0109775 | A1 | 5/2010 | Kamakura et al. |
| 2010/0232248 | A1 | 9/2010 | Erickson et al. |
| 2017/0005043 | A1 | 1/2017 | Pagani et al. |

OTHER PUBLICATIONS

Jaeger, R.C. et al., "CMOS Stress Sensors on (100) Silicon," IEEE Journal of Solid-State Circuits, vol. 35, No. 1, Jan. 2000, 11 pages.
Kuo, H.I. et al., "Smart-Cu, Piezoresistive Strain Sensors for High Temperature Applications," IEEE Sensors 2009 Conference, 3 pages.
Motta, A. et al., U.S. Appl. No. 14/754,788, filed Jun. 15, 2015.
Salette, A. et al., "A New Method to Extract Piezoresistive Coefficients in Polysilicon Through Gauges Placed on a MEMS Membrane," Procedia Engineering, 47 (Sep. 9-12, 2012), Poland, 4 pages.
Suhling, J.C. et al., "Silicon Piezoresistive Stress Sensors and Their Application in Electronic Packaging," IEEE Sensors Journal, vol. 1, No. 1, Jun. 2001, 17 pages.

* cited by examiner

INTEGRATED CIRCUIT (IC) INCLUDING SEMICONDUCTOR RESISTOR AND RESISTANCE COMPENSATION CIRCUIT AND RELATED METHODS

CROSS-REFERENCE TO RELATED APPLICATIONS

This application is a continuation of U.S. application Ser. No. 14/754,799, filed on Jun. 30, 2015, which application is hereby incorporated herein by reference.

TECHNICAL FIELD

The present invention is directed to the field of integrated circuits, and, more particularly to integrated circuits including a semiconductor resistor and related methods.

BACKGROUND

Diffused or implanted resistors on a semiconductor substrate such as silicon may be sensitive to mechanical stress due to piezoresistivity phenomena. So, an increased stress into an integrated circuit (IC) may lead to an increased variation of electrical parameters and a functional failure can happen. For example, the difference between thermal coefficients of silicon and package materials may be a source of internal stress by causing geometric deformations. Also, the packaging process and the package of an IC may be source of stress on the IC.

U.S. Pat. No. 7,437,260 discloses using a particular layout of semiconductor resistors made up with a series of a P-doped resistor and an N-doped resistor, each in an L-shape, and with a very precise selected fixed ratio may theoretically eliminate planar stress dependence at a given temperature. In general, this selected fixed scaling ratio depends on temperature and doping concentration. However, due to variability in the semiconductor manufacturing process, there may be a resistor mismatch, and the ratio cannot be very precise and must be modified with the temperature. In fact, the N-doping and P-doping process are two different and sequential operations that are affected by variability and so a very precise scaling ratio cannot be achieved.

Thus, due to manufacturing process variability and temperature variations during IC's operating time, it may be particularly desirable to obtain an increased control of the scaling factor/ratio to reduce/eliminate the planar stresses sensitivity.

SUMMARY

An integrated circuit (IC) may include a semiconductor substrate, and a semiconductor resistor. The semiconductor resistor may include a well in the semiconductor substrate and having a first conductivity type, a first resistive region in the well having an L-shape and a second conductivity type, and a tuning element associated with the first resistive region. The IC may also include a resistance compensation circuit on the semiconductor substrate. The resistance compensation circuit may be configured to measure an initial resistance of the first resistive region, and generate a voltage at the tuning element to tune an operating resistance of the first resistive region based upon the measured initial resistance. Accordingly, stress, for example, planar stresses, may be reduced.

The semiconductor resistor may also include a second resistive region in the semiconductor substrate, adjacent the well, having the first conductivity type, having an L-shape, and being coupled to the first resistive region, for example. The IC may further include a testing element coupled between the first and second resistive regions.

The tuning element may include an insulating layer above at least a portion of the second resistive region, and a conductive layer above the insulating layer. The tuning element may include an insulating layer above at least a portion of the first resistive region, and a conductive layer above the insulating layer, for example. The tuning element may also include a doped region in the well having the first conductivity type and having a higher dopant concentration than the well, and a contact coupled to the doped region.

The IC may further include a temperature sensor on the semiconductor substrate and coupled to the resistance compensation circuit. The resistance compensation circuit may be configured to generate the voltage at the tuning element based upon the temperature sensor, for example.

The resistance compensation circuit may include a processor and a memory coupled thereto. The memory may be configured to store at least one resistance compensation value. The first resistive region may have a serpentine shape, for example.

A method aspect is directed to a method of compensating resistance in an integrated circuit (IC). The method may include using a resistance compensation circuit on a semiconductor substrate to generate a voltage at a tuning element associated with a first resistive region of a semiconductor resistor to tune an operating resistance of the first resistive region based upon an measured initial resistance. The first resistive region may be in a well and may have an L-shape and a second conductivity type. The well may be in the semiconductor substrate and having a first conductivity type.

DETAILED DESCRIPTION OF ILLUSTRATIVE EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation and numbers in increments of one hundred are used to refer to like elements in different embodiments.

Figure 1:
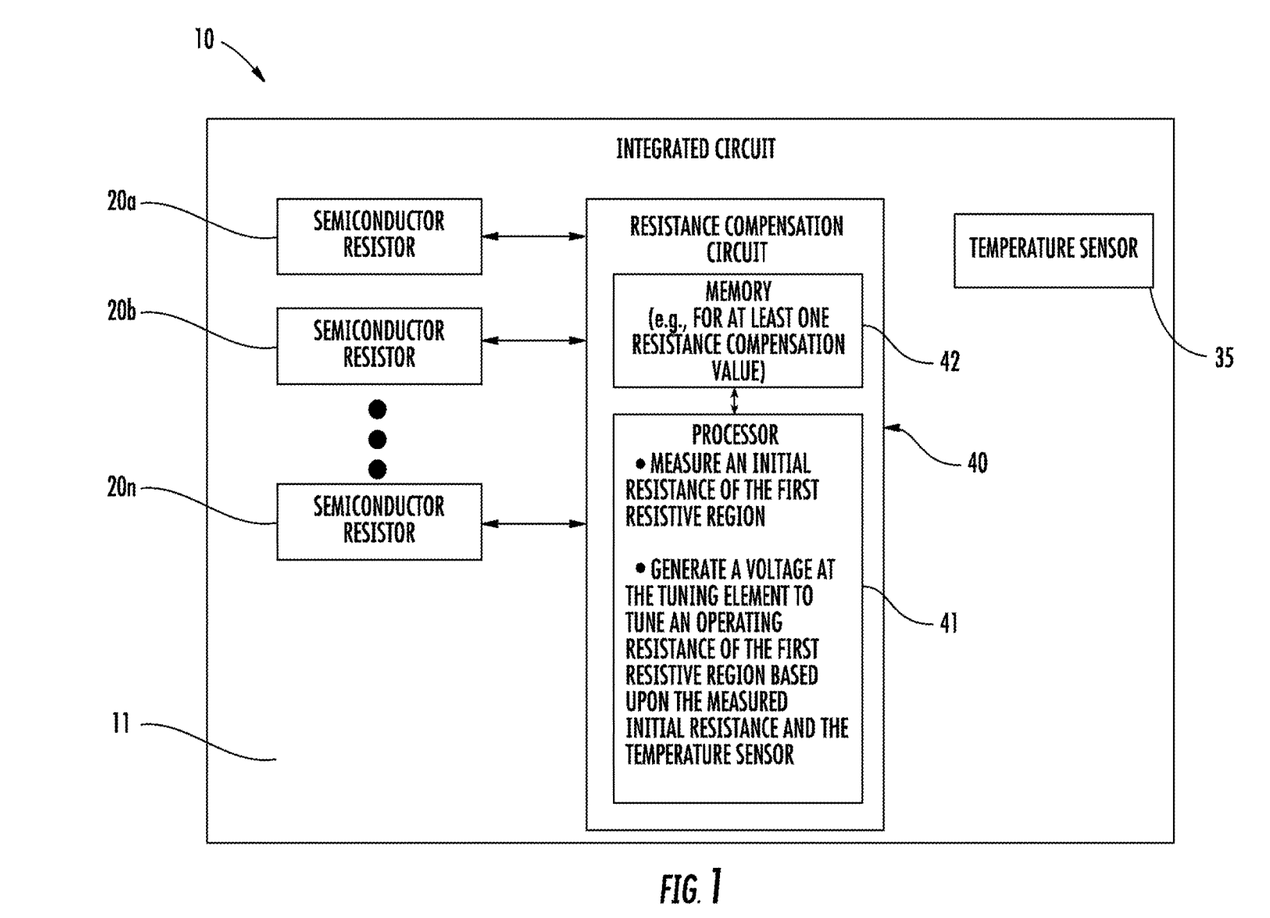
FIG. 1 is a schematic block diagram of an IC in accordance with an embodiment of the present invention.
Figure 2:
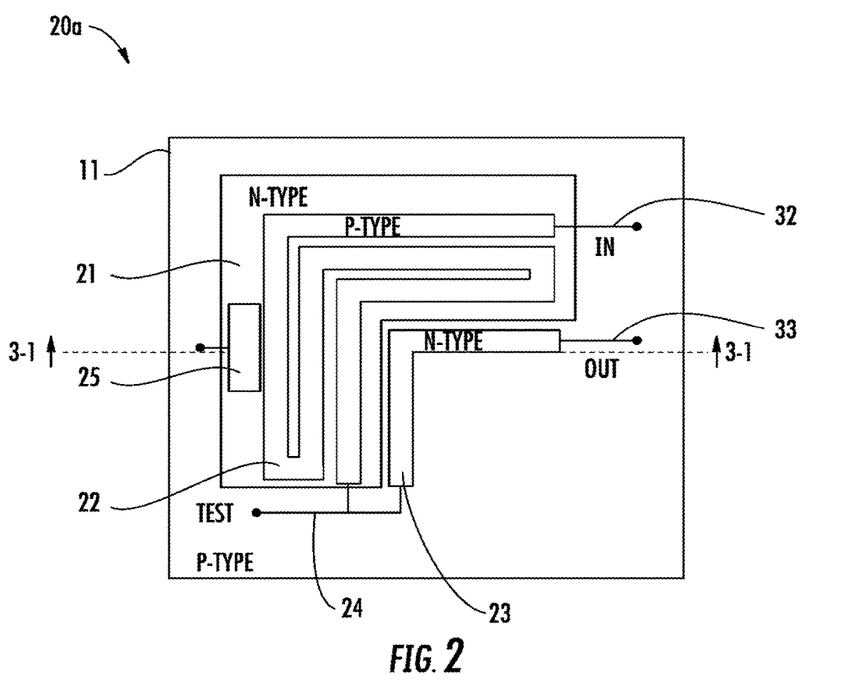
FIG. 2 is a plan view of an exemplary semiconductor resistor of the IC of FIG. 1.
Figure 3:
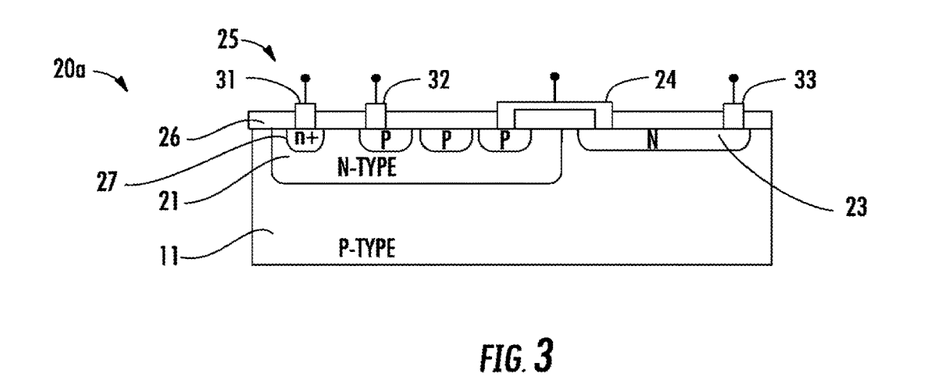
FIG. 3 is a schematic cross-section view of the semiconductor resistor of FIG. 2 taken along the line 3-1.

Referring initially to FIGS. 1-3, an integrated circuit (IC) 10 illustratively includes a semiconductor substrate 11, and semiconductor resistors 20a-20n. Each semiconductor resistor 20a-20n includes a well 21 in the semiconductor substrate 11. The well 21 has a first conductivity type, for example, an n-type well. The semiconductor substrate 11 may have a conductivity type that is opposite from the well 21, for example, p-type, as will be described detail below.

Each semiconductor resistor 20a-20n also includes a first resistive region 22 in the well 21. The first resistive region 22 has an L-shape, and more particularly, a serpentine shape. Each first resistive region 22 has a second conductivity type, opposite from the first conductivity type, for example, p-type.

Each semiconductor resistor 20a-20n also includes a second resistive region 23 in the semiconductor substrate 11 adjacent the well 21, and more particularly, laterally adjacent and spaced within the semiconductor substrate from the well. The second region has the first conductivity type, i.e., n-type, and also has an L-shape. An insulating layer 26 is carried above the first and second resistive regions 20, 23 and the well 21.

Each semiconductor resistor 20a-20n also includes a tuning element 25 associated with the first resistive region 22. The tuning element 25 may include a doped region 27 in the well 21. The doped region 27 has the first conductivity type, i.e., n-type, but has a higher dopant concentration than the well. The tuning element 25 also includes a contact or via 31 coupled to the doped region 27 through the insulating layer 26.

A testing element 24 is coupled between the first and second resistive regions 22, 23. In other words, the first and second resistive regions 22, 23 are coupled by way of the testing element 24. The testing element 24 may be in the form of a contact that extends through the insulating layer 26.

In input contact 32 or terminal extends through the insulating layer 26 and couples to the first resistive region 22. An output contact 33 or terminal extends through the insulating layer 26 and couples to the second resistive region 23. In some applications, the terminals 33, 32 may be exchanged and used as an input contact and an output contact, respectively.

The IC 10 may include a temperature sensor 35 on the semiconductor substrate 11. The IC 10 also illustratively includes a resistance compensation circuit 40 that is on the semiconductor substrate 11 and coupled to the temperature sensor 35 and the semiconductor resistors 20a-20n. The resistance compensation circuit 40 may include a processor 41 and a memory 42 coupled thereto, and may provide control of the scaling factor/ratio d. The corrections to the scaling factor d due to the process mismatch and temperature variations can be stored in the memory 42. In other embodiments (not shown) the processor 41 may be replaced by a microcontroller or dedicated digital circuit as a finite state machine.

To control the process mismatch, the processor 41 is configured to measure an initial resistance of the first and second resistive regions 22, 23 of at least one of the semiconductor resistor 20a-20n. At a first time, this measurement is preferably performed during electrical testing at the wafer level, or before assembly to reduce package stress that modify the resistance values.

The testing element 24 cooperates with the resistance compensation circuit 40 during testing to measure the resistance of both the first and second resistive regions 22, 23 to determine the process mismatch and the scaling factor d. A fine tuning may be calculated and applied as the voltage at the tuning element 25 to compensate for the mismatch for the semiconductor resistor 20a-20n and saved into memory 42. In fact, for example, for a single die, the process variability of the semiconductor resistor's value can be considered the same, but this may not be particularly true at the wafer level, as will be understood by those skilled in the art.

To take control of temperature variation, it may be possible to characterize the IC in terms of temperature, and it may be possible to calculate a resistive compensation plot for some temperature values. These values may be saved into the memory 42.

The processor 41 is also configured to generate a voltage at the tuning element 25 to tune an operating resistance of the first resistive region 22 based upon the measured initial resistance and the temperature sensor 35. For example over time, a compensation value is calculated starting from a stored compensation value, for example, by interpolation. During operation, the tuning element 25 cooperates with the resistance compensation circuit 40 to modify the depletion region of the junction between the well 21 (e.g., n-well) and the first resistive region 22. The voltage value, or resistive compensation value, at the contact 31 of the tuning element 25 may be saved in the memory 42. The configuration of the IC 10 described herein may allow relatively close proximity between resistors and between resistive regions, thus reducing silicon area, for example.

Figure 4:
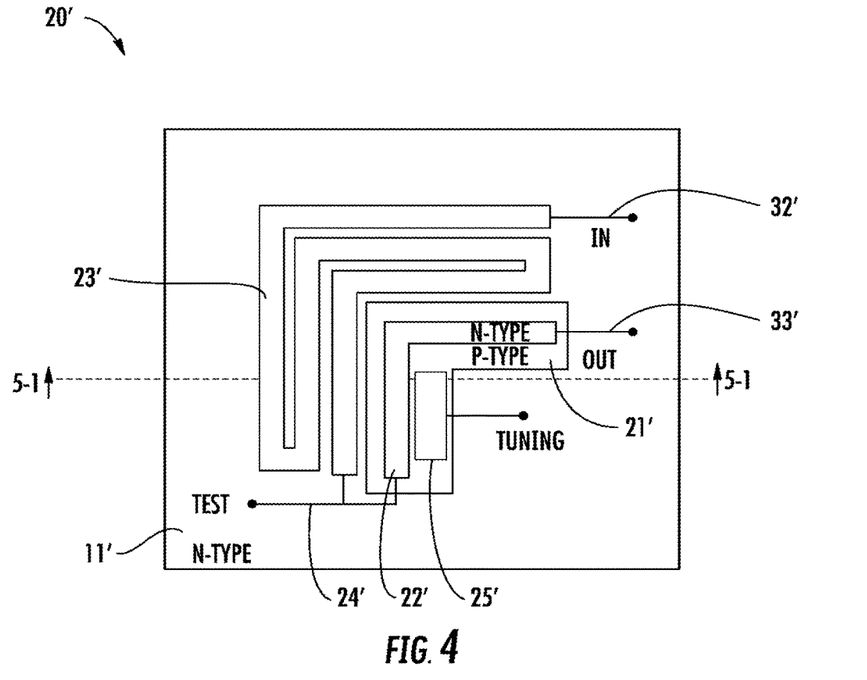
FIG. 4 is a plan view of an exemplary semiconductor resistor according to another embodiment of the present invention.
Figure 5:
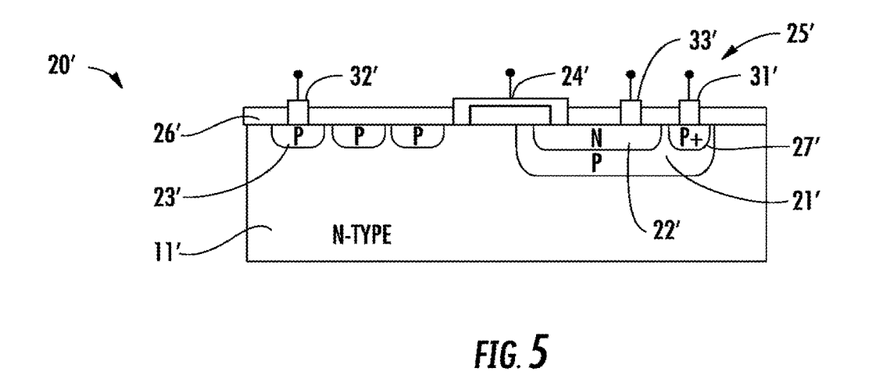
FIG. 5 is a schematic cross-sectional view of the semiconductor resistor of FIG. 4 taken along the line 5-1.

Referring now to FIGS. 4-5, a semiconductor resistor 20' according to another embodiment, and particularly, a p-doped semiconductor resistor, for example for use in the system 10 described above is illustrated. The well 21' is in an n-type semiconductor substrate if and has p-type conductivity.

A first resistive region 22' is in the well 21'. The first resistive region 22' has an L-shape. The first resistive region 22' has a second conductivity type, opposite from the first conductivity type, for example, n-type.

The semiconductor resistor 20' also includes a second resistive region 23' in the semiconductor substrate 11' adjacent the well 21', and more particularly, laterally adjacent and spaced within the semiconductor substrate from the well. The second region 23' has the first conductivity type, i.e., p-type, and also has an L-shape, and more particularly, a serpentine shape. An insulating layer 26' is carried above the first and second resistive regions 20', 23' and the well 21'.

A tuning element 25' is associated with the first resistive region 22'. The tuning element 25' may include a doped region 27' in the well 21'. The doped region 27' has the first conductivity type, i.e., p-type, but has a higher dopant concentration (p+) than the well 21'. The tuning element 25' also includes a contact 31' coupled to the doped region 27' through the insulating layer 26'.

A testing element 24' is coupled between the first and second resistive regions 22', 23'. In other words, the first and second resistive regions 22', 23' are coupled by way of the testing element 24'. The testing element 24' may be in the form of a contact that extends through the insulating layer 26'.

In input contact 32' or terminal extends through the insulating layer 26' and couples to the second resistive region 23'. An output contact 33' or terminal extends through the insulating layer 26' and couples to the first resistive region 23'. In some applications, the contact or terminals 33', 32' may be exchanged and used as input contact and output contact, respectively. The semiconductor resistor 20' according to the present embodiment may be used in conjunction with or in place of the semiconductor resistors described above with respect to FIGS. 1-3.

Figure 6:
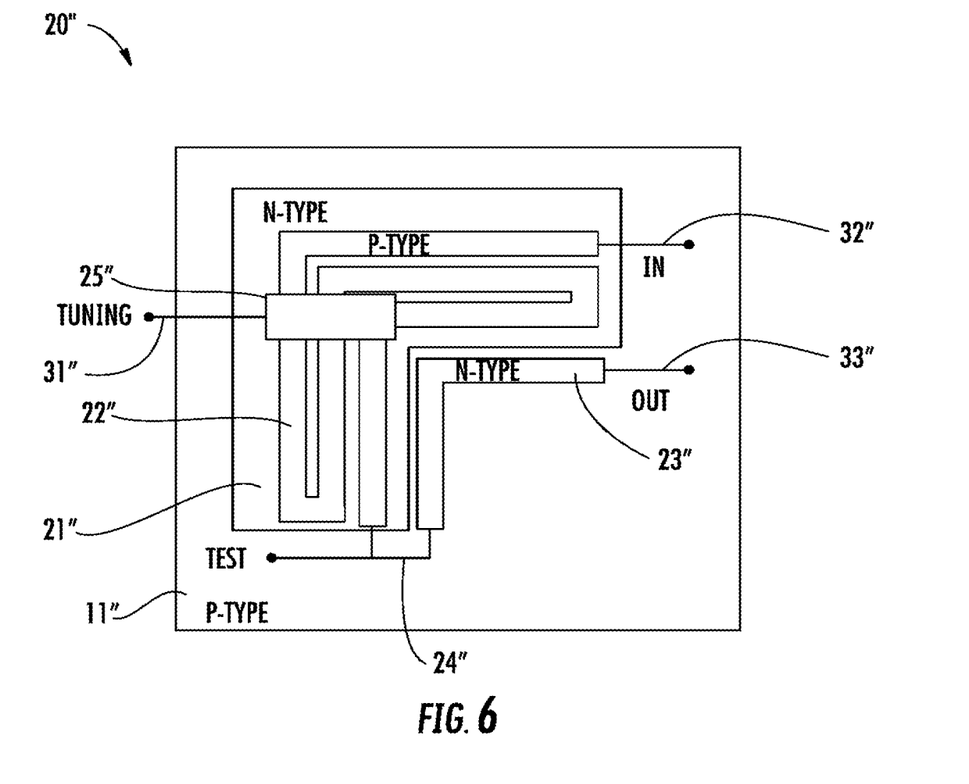
FIG. 6 is a plan view of an exemplary semiconductor resistor according to another embodiment of the present invention.
Figure 7:
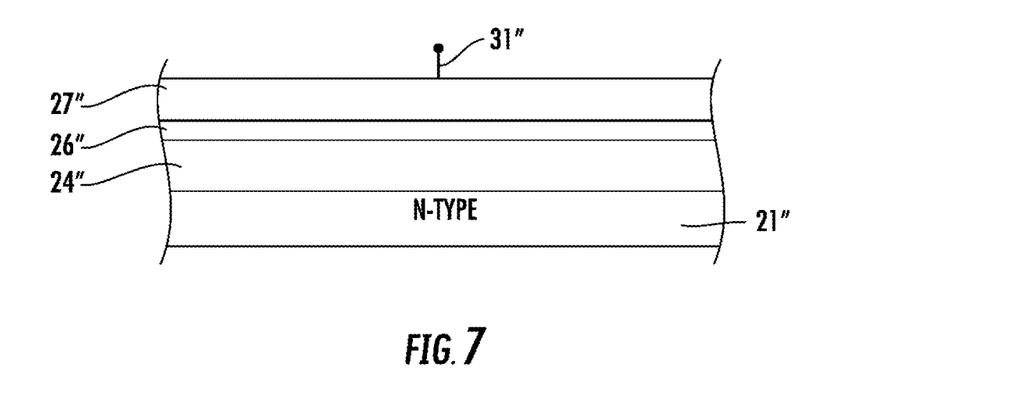
FIG. 7 is a schematic cross-sectional view of a portion of the semiconductor resistor of FIG. 6.

Referring now to FIGS. 6 and 7, a semiconductor resistor 20" according to yet another embodiment is illustrated. As will be appreciated by those skilled in the art, modification of the resistance value of the semiconductor resistor 20" may be though the use of an isolated metal gate over at least a portion of the semiconductor resistor, similar to a metal-oxide semiconductor (MOS) structure, for example, but here differently from a MOS transistor, the source and drain wells and contact/vias are not needed. In particular, the semiconductor resistor 20" includes a well 21" in the semiconductor substrate 11". The well 21" has a first conductivity type, for example, an n-type well. The semiconductor substrate 11" may have a conductivity type that is opposite from the well 21", for example, p-type, as will be described detail below.

The semiconductor resistor 20" includes a first resistive region 22" in the well having an L-shape, and more particularly, a serpentine shape. The first resistive region 22" has a second conductivity type, opposite from the first conductivity type, for example, p-type.

The semiconductor resistor 20" also includes a second resistive region 23" in the semiconductor substrate 11" adjacent the well 21", and more particularly, laterally adjacent and spaced within the semiconductor substrate from the well. The second resistive region 23" has the first conductivity type, i.e., n-type, and also has an L-shape. An insulating layer 26", for example, an oxide layer, is carried above the first and second resistive regions 22", 23" and the well 21'.

The semiconductor resistor 20" also includes a tuning element 25' associated with the first resistive region 22". The tuning element 25" includes a conductive layer 27" over portion of the first resistive region 22", and more particular, over or across the legs of the serpentine shape. The tuning element 25" also includes a contact 31" coupled to the conductive layer 27".

Similar to the embodiments described above, a testing element 24" is coupled between the first and second resistive regions 22", 23". In other words, the first and second resistive regions 22", 23" are coupled by way of the testing element 24". In input contact 32" or terminal is also coupled to the first resistive region 22" and an output contact 33" is coupled to the second resistive region 23". In some applications, the terminals 33, 32" may be exchanged and used as input contact and output contact, respectively.

Figure 8:
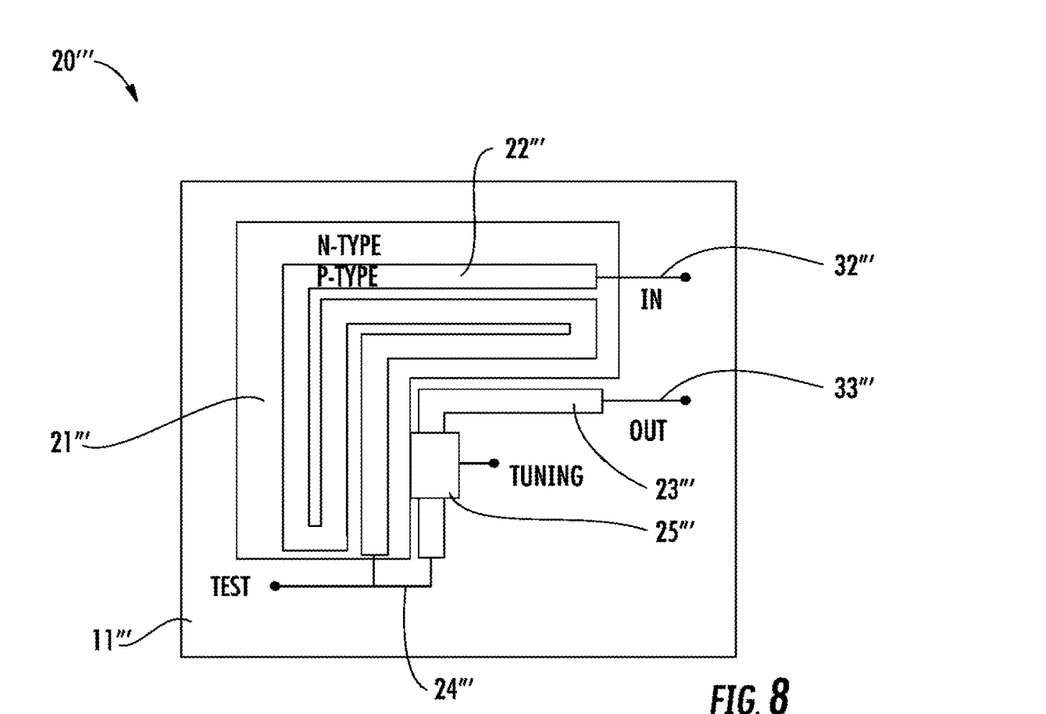
FIG. 8 is a plan view of an exemplary semiconductor resistor according to another embodiment of the present invention.

Referring now to FIG. 8, another embodiment of a semiconductor resistor 20''' using an isolated metal gate similar to a MOS structure is illustrated. The semiconductor resistor 20''' illustratively includes the tuning element 25''' including the conductive layer and the contact over the second resistive region 23''' instead of the first resistive region.

Figure 9:
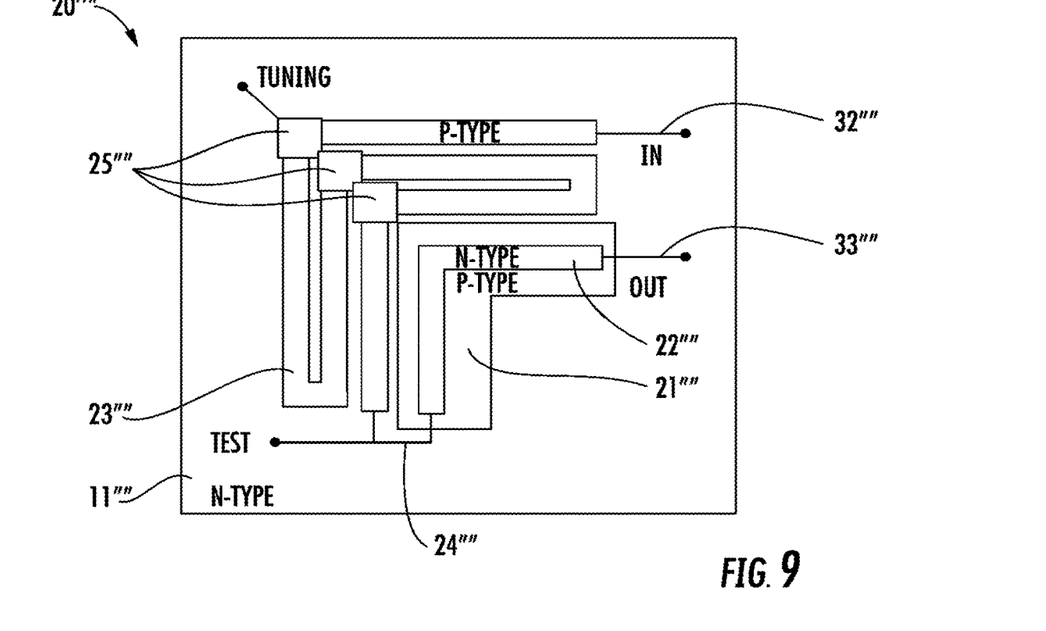
FIG. 9 is a plan view of an exemplary semiconductor resistor according to another embodiment of the present invention.

Referring now to FIG. 9, another embodiment of a semiconductor resistor 20'''' using an isolated metal gate similar to a MOS structure is illustrated. The semiconductor resistor 20'''' includes an n-type substrate 11''''. The tuning element 25'''' is over corners of the serpentine shape of the second resistive region 23''''. The first resistive region 22'''' in this embodiment is an n-type region in a p-type well 21''''. In other words, the semiconductor resistor 20'''' has a layout or configuration similar to that illustrated in FIG. 4.

Figure 10:
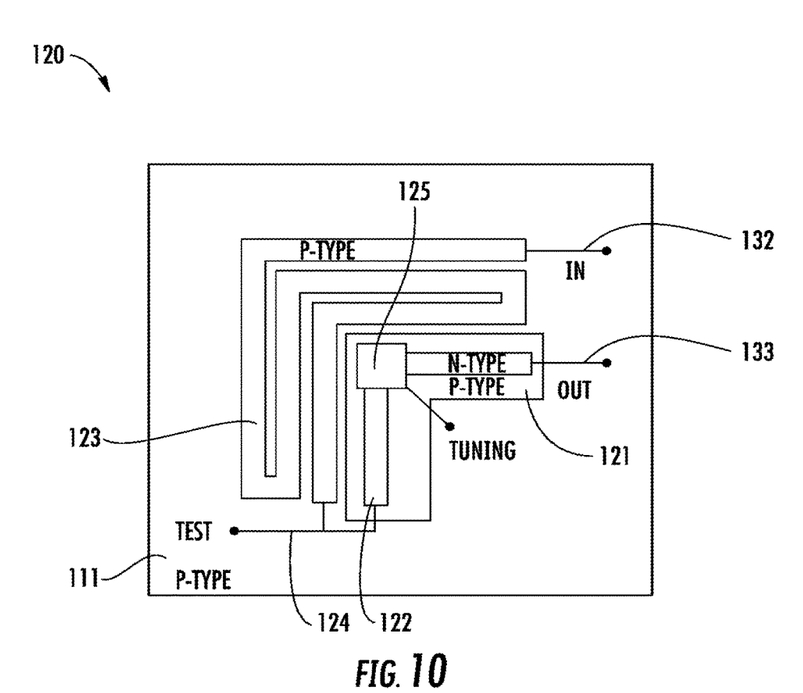
FIG. 10 is a plan view of an exemplary semiconductor resistor according to another embodiment of the present invention.

Referring now to FIG. 10, another embodiment of a semiconductor resistor 120 using an isolated metal gate similar to a MOS structure that includes an n-type substrate 111 is illustrated. The tuning element 125 is over the corner of the L-shaped first resistive region 122 (e.g. n-type) carried by a well 121 (e.g., p-type). The second resistive region 123 has a serpentine shape. In other words, the semiconductor resistor 120 has a layout or configuration similar to that illustrated in FIG. 4.

Figure 11:
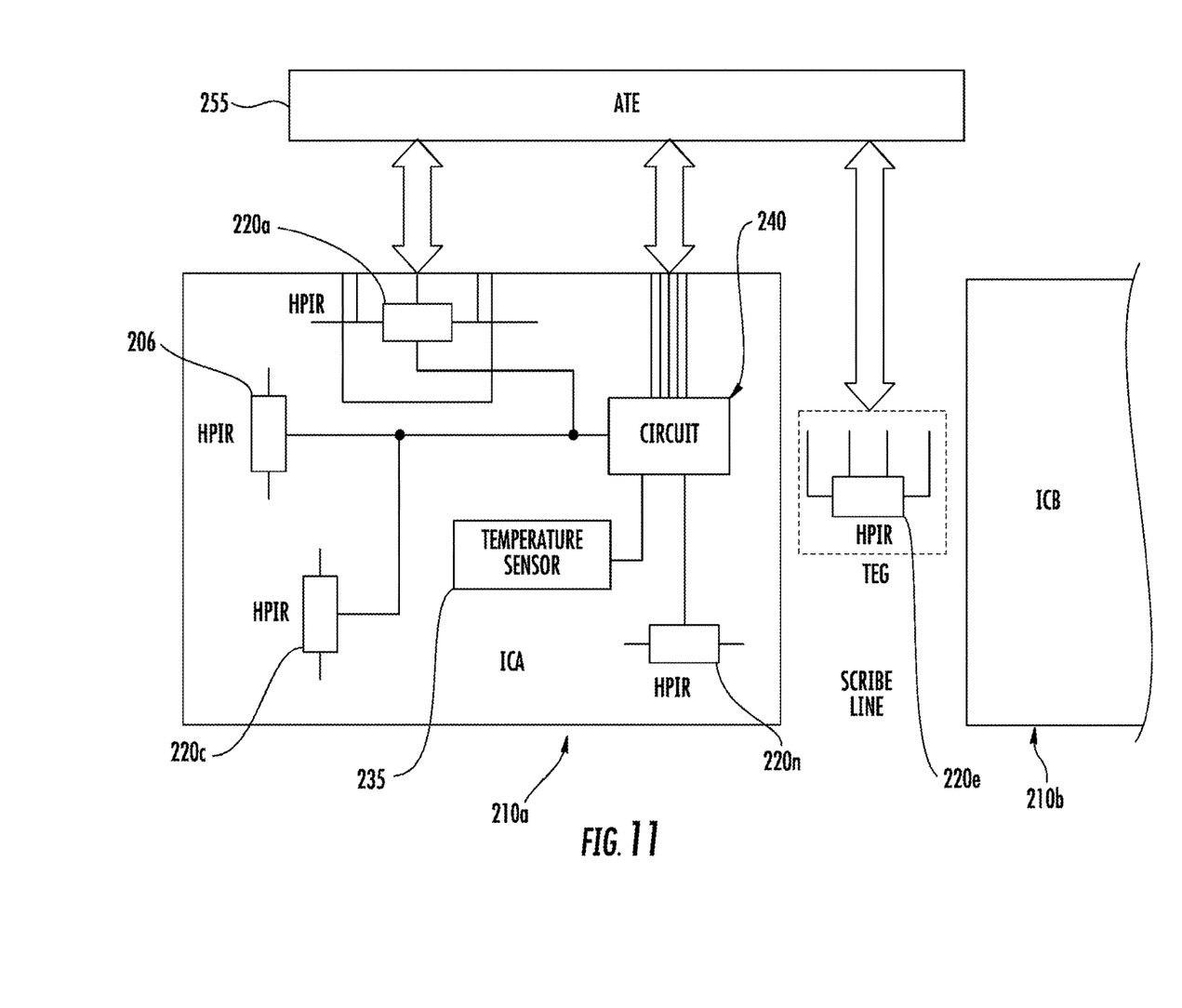
FIG. 11 is a schematic block diagram of a system for tuning an IC in accordance with an embodiment of the present invention.

Referring now additionally to FIG. 11, to "fine tune" the device 210a or IC, for example, to compensate a process mismatch, automatic testing equipment (ATE) 255 may be used and may be coupled to the resistance compensation circuit 240 and at least one of the semiconductor resistors 220a-220n, where each resistor is indicated as a high precision piezo insensitive resistor (HPIR). The ATE 255 may measure the different resistive regions in a given semiconductor resistor to evaluate resistive compensation values, and if needed, store the resistive compensation values in the memory so that resistance variation due to XY planar stress is reduced or eliminated in the best case. This process may be repeated for different temperature values.

During testing, it may be possible to calculate a resistive compensation plot for some values so that the resistance compensation circuit 240 may, for example over time, calculate a compensation value of a desired temperature starting from a stored compensation value, for example, by interpolation. Temperature testing may be performed, for example, using a thermal chuck (plate) of probe equipment (wafer prober). The ATE 255 can measure one semiconductor resistor 220a-220n carried by the IC 210a or each of the semiconductor resistors.

In some embodiments (FIG. 11), a semiconductor resistor 220e may be placed inside a scribe line between the device 210a and another device 210b, for example, similar to a test element group (TEG) structure, which is generally measured during parametric testing. TEGs on a given wafer, for example, may be measured to provide the corrections to process mismatch of each semiconductor resistor in each IC, for example, using adaptive algorithms. The resistance compensation circuit 240 may fine tune different groups of semiconductor resistors.

Then, the compensation of XY planar stress that is performed at a final test (FT) level of an IC inside a package, may be executed at wafer test (EWS, Electrical Wafer Sort) level, thus increasing quality and reliability.

In another embodiment (not shown) the processor 41 may be external to IC 10 as another IC, for example an application specific IC (ASIC) coupled to at least one IC 10 like in a system in package (SiP), then in this ASIC can be stored the compensation values related to at least one IC 10.

A method aspect is directed to a method of compensating resistance in an integrated circuit (IC) 10. The method includes using a resistance compensation circuit 40 on a semiconductor substrate 11 to generate a voltage at a tuning element 25 associated with a first resistive region 22 of a semiconductor resistor 20 to tune an operating resistance of the first resistive region based upon an measured initial resistance. The first resistive region 22 is in a well 21 and has an L-shape and has a second conductivity type. The well 21 is in the semiconductor substrate 11 and has a first conductivity type.

While several embodiments of an integrated circuit have been described herein with exemplary semiconductor resistor configurations, it should understood that there can be any number of semiconductor resistors, including just one, and/or any number of configuration includes any number of a different type or of a same type of semiconductor resistor.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that, modifications and embodiments are intended to be included within the scope of the appended claims.

What is claimed is:

1. A method of compensating resistance in an integrated circuit (IC), the method comprising:
   providing a four terminal resistor in a semiconductor substrate, the resistor comprising a first resistor and a second resistor coupled in series, a first terminal at a first end of the resistor, a second terminal at a second end of the resistor, a test terminal at a node connecting the first resistor and the second resistor, and a tuning terminal, the first resistor having a first conductivity type, the first resistor comprising a first portion extending along a first direction and a second portion extending along a second direction perpendicular to the first direction, the second resistor having a second conductivity type opposite to the first conductivity type;
   applying a first voltage between the first terminal and the test terminal to measure a first resistance of the first resistor;
   applying a second voltage between the second terminal and the test terminal to measure a second resistance of the second resistor; and
   computing a voltage to be applied at the tuning terminal to control a scaling factor/ratio between the first resistance and the second resistance.

2. The method of claim 1, further comprising:
   storing the computed voltage in a non-volatile memory.

3. The method of claim 2, further comprising:
   applying a voltage between the first terminal and the second terminal; and
   applying the voltage stored in the non-volatile memory at the tuning terminal.

4. The method of claim 1, further comprising:
   providing a temperature sensor to measure a temperature value at the first resistor and the second resistor.

5. The method of claim 1, wherein the first portion intersects with the second portion in a common region, wherein the tuning terminal is disposed directly over the common region of the first resistor and not the remaining first and second portions of the first resistor, and wherein the tuning terminal is capacitively coupled to the common region of the first resistor.

6. The method of claim 1, further comprising:
   after computing the voltage, dicing the semiconductor substrate into a plurality of semiconductor dies.

7. The method of claim 1, wherein the first resistor is disposed in a well region comprising the second conductivity, wherein the tuning terminal is directly coupled to the well region.

8. The method of claim 1, wherein the tuning terminal is disposed directly over a part of the first portion of the first resistor and not the second portion, and wherein the tuning terminal is capacitively coupled to the first resistor.

9. A method of compensating resistance in an integrated circuit (IC), the method comprising:
   providing a four terminal resistor in a semiconductor substrate, the resistor comprising a first resistor and a second resistor coupled in series, a first terminal at a first end of the resistor, a second terminal at a second end of the resistor, a test terminal at a node connecting the first resistor and the second resistor, and a tuning terminal, the first resistor having a first conductivity type, the second resistor having a second conductivity type opposite to the first conductivity type;
   heating the semiconductor substrate to a first temperature;
   at the first temperature, measuring the resistance of the first resistor and the resistance of the second resistor by applying a first voltage between the first terminal and the test terminal and applying a second voltage between the second terminal and the test terminal;
   heating the semiconductor substrate to a second temperature;
   at the second temperature, measuring the resistance of the first resistor and the resistance of the second resistor by applying the first voltage between the first terminal and the test terminal and applying the second voltage between the second terminal and the test terminal; and
   generating a resistive compensation plot for computing a voltage to be applied at the tuning terminal to control a scaling factor/ratio between the first resistor and the second resistor for an operating temperature.

10. The method of claim 9, further comprising providing a temperature sensor to measure a temperature value at the first resistor and the second resistor.

11. The method of claim 9, further comprising:
    storing the resistive compensation plot in a non-volatile memory.

12. The method of claim 11, further comprising:
    measuring a temperature at the first resistor; and
    based on the measured temperature, applying a voltage from the resistive compensation plot stored in the non-volatile memory at the tuning terminal.

13. The method of claim 9, wherein the first resistor is longer than the second resistor.

14. The method of claim 9, further comprising:
    after generating the resistive compensation plot, dicing the semiconductor substrate into a plurality of semiconductor dies.

15. The method of claim 9, wherein the first resistor is disposed in a well region comprising the second conductivity, wherein the tuning terminal is directly coupled to the well region.

16. The method of claim 9, wherein the first resistor comprises a first portion and a second portion in a top view, wherein the tuning terminal is disposed directly over the first portion of the first resistor and not the second portion, and wherein the tuning terminal is capacitively coupled to the first portion of the first resistor.

17. An integrated circuit (IC) comprising:
    a four terminal resistor in a semiconductor substrate, the resistor comprising a first resistor and a second resistor coupled in series, a first terminal at a first end of the resistor, a second terminal at a second end of the resistor, a test terminal at a node connecting the first resistor and the second resistor, and a tuning terminal, the first resistor having a first conductivity type, the first resistor comprising a first portion extending along a first direction and a second portion extending along a second direction perpendicular to the first direction, the second resistor having a second conductivity type opposite to the first conductivity type;

a testing element coupled between the first resistor and the second resistor, the testing element configured to
apply a first voltage between the first terminal and the test terminal, and
apply a second voltage between the second terminal and the test terminal; and a resistance compensation circuit on the semiconductor substrate, the resistance compensation circuit configured to
measure a first resistance of the first resistor when the first voltage is applied,
measure a second resistance of the second resistor when the second voltage is applied, and
compute a voltage to be applied at the tuning terminal to control a scaling factor/ratio between the first resistance and the second resistance.

18. The IC of claim 17, further comprising:
a non-volatile memory to store the computed voltage.

19. The IC of claim 18, wherein the resistance compensation circuit is further configured to
apply a voltage between the first terminal and the second terminal; and
apply the voltage stored in the non-volatile memory at the tuning terminal.

20. The IC of claim 17, further comprising:
a temperature sensor configured to measure a temperature value at the first resistor and the second resistor.

21. The IC of claim 17, wherein the second resistor comprises a third portion extending along a third direction and a fourth portion extending along a fourth direction perpendicular to the third direction.

22. The IC of claim 21, wherein the third direction is the same as the first direction, and wherein the fourth direction is the same as the second direction.

23. The IC of claim 21, wherein the first portion and the second portion each have a first resistance, and wherein the third portion and the fourth portion each have a second resistance.

24. The IC of claim 17, wherein the first portion intersects with the second portion in a common region, wherein the tuning terminal is disposed directly over the common region of the first resistor and not the remaining first and second portions of the first resistor, and wherein the tuning terminal is capacitively coupled to the common region of the first resistor.

25. The IC of claim 17, wherein the first resistor is longer than the second resistor.

26. The IC of claim 17, wherein the first resistor is disposed in a well region comprising the second conductivity, wherein the tuning terminal is directly coupled to the well region.

27. The IC of claim 17, wherein the tuning terminal is disposed directly over a part of the first portion of the first resistor and not the second portion, and wherein the tuning terminal is capacitively coupled to the first resistor.

28. An integrated circuit (IC) comprising:
a four terminal resistor in a semiconductor substrate, the resistor comprising a first resistor and a second resistor coupled in series, a first terminal at a first end of the resistor, a second terminal at a second end of the resistor, a test terminal at a node connecting the first resistor and the second resistor, and a tuning terminal, the first resistor having a first conductivity type, the second resistor having a second conductivity type opposite to the first conductivity type;

a testing element coupled between the first resistor and the second resistor, the testing element configured to
apply a first voltage between the first terminal and the test terminal, and
apply a second voltage between the second terminal and the test terminal; and a resistance compensation circuit disposed on the semiconductor substrate, the resistance compensation circuit configured to
at a first temperature, measure the resistance of the first resistor and the resistance of the second resistor by applying the first voltage between the first terminal and the test terminal and applying the second voltage between the second terminal and the test terminal;
at a second temperature, measure the resistance of the first resistor and the resistance of the second resistor by applying the first voltage between the first terminal and the test terminal and applying the second voltage between the second terminal and the test terminal; and
generate a resistive compensation plot for computing a voltage to be applied at the tuning terminal to control a scaling factor/ratio between the first resistor and the second resistor for an operating temperature.

29. The IC of claim 28, further comprising a temperature sensor configured to measure a temperature value at the first resistor and the second resistor.

30. The IC of claim 28, further comprising:
a non-volatile memory to store the resistive compensation plot.

31. The IC of claim 30, wherein the resistance compensation circuit is further configured to:
measure a temperature at the first resistor; and
based on the measured temperature, apply a voltage from the resistive compensation plot stored in the non-volatile memory at the tuning terminal.

32. The IC of claim 28, wherein the first resistor comprises a first portion extending along a first direction and a second portion extending along a second direction perpendicular to the first direction, wherein the second resistor comprises a third portion extending along a third direction and a fourth portion extending along a fourth direction perpendicular to the third direction.

33. The IC of claim 32, wherein the third direction is the same as the first direction, and wherein the fourth direction is the same as the second direction.

34. The IC of claim 32, wherein the first portion intersects with the second portion in a common region, wherein the tuning terminal is disposed directly over the common region of the first resistor and not the remaining first and second portions of the first resistor, and wherein the tuning terminal is capacitively coupled to the common region of the first resistor.

35. The IC of claim 28, wherein the first resistor is longer than the second resistor.

36. The IC of claim 28, wherein the first resistor is disposed in a well region comprising the second conductivity, wherein the tuning terminal is directly coupled to the well region.

37. The IC of claim 28, wherein the first resistor comprises a first portion and a second portion in a top view, wherein the tuning terminal is disposed directly over the first portion of the first resistor and not the second portion, and wherein the tuning terminal is capacitively coupled to the first portion of the first resistor.

38. The method of claim 1, wherein controlling the scaling factor/ratio between the first resistance and the second resistance comprises compensating for process mismatch between the first resistance and the second resistance.

39. The method of claim 1, wherein controlling the scaling factor/ratio between the first resistance and the second resistance comprises compensating for temperature variations between the first resistance and the second resistance.

40. The method of claim 9, wherein controlling the scaling factor/ratio between the first resistance and the second resistance comprises compensating for process mismatch between the resistance of the first resistor and the resistance of the second resistor.

41. The method of claim 9, wherein controlling the scaling factor/ratio between the first resistance and the second resistance comprises compensating for temperature variations between the resistance of the first resistor and the resistance of the second resistor.

42. The IC of claim 17, wherein the resistance compensation circuit is configured to control the scaling factor/ratio between the first resistance and the second resistance by compensating for process mismatch between the first resistance and the second resistance.

43. The IC of claim 28, wherein the resistance compensation circuit is configured to control the scaling factor/ratio between the first resistance and the second resistance by compensating for temperature variations between the resistance of the first resistor and the resistance of the second resistor.

* * * * *